United States Patent
Yamatsu et al.

(10) Patent No.: US 11,195,769 B2
(45) Date of Patent: Dec. 7, 2021

(54) THERMOSETTING COMPOSITION FOR USE AS UNDERFILL MATERIAL, AND SEMICONDUCTOR DEVICE

(71) Applicant: PANASONIC INTELLECTUAL PROPERTY MANAGEMENT CO., LTD., Osaka (JP)

(72) Inventors: Shigeru Yamatsu, Osaka (JP); Naoki Kanagawa, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 113 days.

(21) Appl. No.: 16/491,808

(22) PCT Filed: Feb. 27, 2018

(86) PCT No.: PCT/JP2018/007139
§ 371 (c)(1),
(2) Date: Sep. 6, 2019

(87) PCT Pub. No.: WO2018/163900
PCT Pub. Date: Sep. 13, 2018

(65) Prior Publication Data
US 2020/0381321 A1 Dec. 3, 2020

(30) Foreign Application Priority Data
Mar. 7, 2017 (JP) .............................. JP2017-043167

(51) Int. Cl.
*H01L 23/29* (2006.01)
*C08K 3/36* (2006.01)
(Continued)

(52) U.S. Cl.
CPC .............. *H01L 23/296* (2013.01); *C08K 3/36* (2013.01); *H01L 23/31* (2013.01); *H01L 24/07* (2013.01)

(58) Field of Classification Search
CPC ...................................................... H01L 23/296
(Continued)

(56) References Cited

U.S. PATENT DOCUMENTS

| 10,703,939 B2 | 7/2020 | Watanabe et al. |
| 10,870,756 B2 | 12/2020 | Yamatsu et al. |

(Continued)

FOREIGN PATENT DOCUMENTS

| JP | 2001-068604 | 3/2001 |
| JP | 2002-194057 | 7/2002 |

(Continued)

OTHER PUBLICATIONS

Official Communication issued in International Patent Application No. PCT/JP2018/007139, dated Apr. 24, 2018, along with an English translation thereof.
(Continued)

*Primary Examiner* — Ajay Arora
(74) *Attorney, Agent, or Firm* — Greenblum & Bernstein, P.L.C.

(57) ABSTRACT

A thermosetting composition for use as an underfill material contains: a mono- or bifunctional acrylic compound; a thermo-radical polymerization initiator; silica; and an elastomer including a 1,2-vinyl group. The thermosetting composition is liquid and has a property of turning, when cured thermally, into a cured product having a relative dielectric constant of 3.2 or less at 25° C. and a dielectric loss tangent of 0.013 or less at 25° C.

7 Claims, 1 Drawing Sheet

(51) Int. Cl.
*H01L 23/31* (2006.01)
*H01L 23/00* (2006.01)

(58) Field of Classification Search
USPC .......................................................... 257/787
See application file for complete search history.

(56) References Cited

U.S. PATENT DOCUMENTS

| | | | |
|---|---|---|---|
| 2014/0242757 A1* | 8/2014 | Yoko | H01L 24/83 |
| | | | 438/113 |
| 2016/0190094 A1 | 6/2016 | Yoko et al. | |
| 2017/0301597 A1* | 10/2017 | Hoshiyama | H01L 23/29 |
| 2019/0100646 A1 | 4/2019 | Myodo et al. | |
| 2019/0284395 A1* | 9/2019 | Kasahara | C08L 79/08 |
| 2019/0284442 A1 | 9/2019 | Watanabe et al. | |
| 2020/0010675 A1 | 1/2020 | Yamatsu et al. | |

FOREIGN PATENT DOCUMENTS

| | | | |
|---|---|---|---|
| JP | 2015-017169 | 1/2015 | |
| JP | 2015-503220 | 1/2015 | |
| JP | 2015-052035 | 3/2015 | |
| JP | 2015-078303 | 4/2015 | |
| JP | 2015-108155 | 6/2015 | |
| JP | 2017-171793 | 9/2017 | |
| JP | 2017-179186 | 10/2017 | |
| WO | 2018/030112 | 2/2018 | |
| WO | 2018/030113 | 2/2018 | |
| WO | WO-2020085770 A1 * | 4/2020 | ........... C07D 403/12 |

OTHER PUBLICATIONS

Official Communication issued in CN Application No. 201880015827.6; dated Mar. 10, 2021; English translation.

* cited by examiner

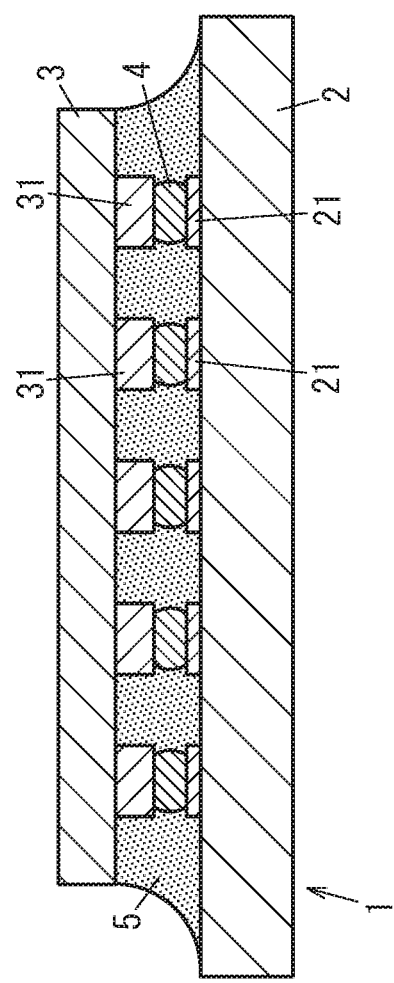

THERMOSETTING COMPOSITION FOR USE AS UNDERFILL MATERIAL, AND SEMICONDUCTOR DEVICE

Cross Reference to Related Applications

This is a US National Stage of International Application No. PCT/JP2018/007139, filed on Feb. 27, 2018, which claims priority to Japanese Patent Application No. 2017-043167 filed on Mar. 7, 2017, the entire contents of each of which being hereby incorporated by reference.

TECHNICAL FIELD

The present invention relates to a thermosetting composition for use as an underfill material, and a semiconductor device including a sealant made of the thermosetting composition for use as an underfill material.

BACKGROUND ART

An underfilling technique is broadly used to fabricate a semiconductor device by flip chip bonding a semiconductor chip facedown onto a board. Specifically, according to the underfilling technique, after the semiconductor chip has been bonded onto the board, the gap between the board and the semiconductor chip is filled, and thereby sealed, with a resin composition (see, for example, Patent Literature 1).

Recently, there has been an increasing demand for semiconductor devices operating as radio frequency (RF) devices. In other words, semiconductor devices have been increasingly required to transmit, receive, and process RE signals. For example, a semiconductor device used as a constituent element of an onboard radar is required to transmit, receive, and process a millimeter wave. The same demand needs to be fulfilled to establish a next-generation wireless high-speed communications system or to reform an existent wired facility into a wireless one.

CITATION LIST

Patent Literature
    Patent Literature 1: JP 2015-108155 A

SUMMARY OF INVENTION

The present inventors paid special attention to the effect of a sealant on the RF characteristics of a semiconductor device.

An object of the present invention is to provide a thermosetting composition for use as an underfill material to seal a gap between a board and a semiconductor chip bonded facedown onto the board and having the ability to improve the RF characteristics of a semiconductor device and also provide a semiconductor device including a sealant made of such a thermosetting composition for use as an underfill material.

A thermosetting composition for use as an underfill material according to an aspect of the present invention contains: a mono- or bifunctional acrylic compound; a thermo-radical polymerization initiator; silica; and an elastomer including a 1,2-vinyl group. The thermosetting composition is liquid and has a property of turning, when cured thermally, into a cured product having a relative dielectric constant of 3.2 or less at 25° C. and a dielectric loss tangent of 0.013 or less at 25° C.

A semiconductor device according to another aspect of the present invention includes: a board; a semiconductor chip bonded facedown onto the board; and a sealant configured to seal a gap between the board and the semiconductor chip. The sealant is a cured product of the thermosetting composition for use as an underfill material.

BRIEF DESCRIPTION OF DRAWINGS

FIG. 1 is a schematic cross-sectional view illustrating a semiconductor device according to an embodiment of the present invention.

DESCRIPTION OF EMBODIMENTS

Embodiments of the present invention will now be described.

A thermosetting composition for use as an underfill material according to this embodiment (hereinafter referred to as Composition (X)) is used to make a sealant 5 for a semiconductor device 1.

First of all, the semiconductor device 1 will be described. FIG. 1 illustrates an example of the semiconductor device 1. This semiconductor device 1 includes a board 2, a semiconductor chip 3 bonded facedown onto the board 2, and a sealant 5 for sealing the gap between the board 2 and the semiconductor chip 3. The sealant 5 is a cured product of Composition (X). The semiconductor chip 3 includes a plurality of bump electrodes 31 on its surface facing the board 2, while the board 2 includes a conductor wiring 21 on its surface facing the semiconductor chip 3. The bump electrodes 31 and the conductor wiring 21 are positioned with respect to each other, and connected together via solder bumps 4. These bump electrodes 31 and the conductor wiring 21 are embedded in the sealant 5.

A method for fabricating this semiconductor device 1 will be described.

First, Composition (X), the board 2, and the semiconductor chip 3 are provided.

The board 2 may be a motherboard, a package board, or an interposer board, for example. The board 2 includes an insulating substrate of glass epoxy, polyimide, polyester, a ceramic, or any other suitable material and the conductor wiring 21 made of an electrical conductor such as copper and formed on the surface of the insulating substrate.

The semiconductor chip 3 may be either a bare chip or a semiconductor package without limitation. The semiconductor chip 3 may be made of GaAs, SiGe, or any other suitable compound semiconductor. The semiconductor chip 3 may be implemented as a complementary metal-oxide semiconductor (CMOS) chip. The bump electrodes 31 are provided on one surface of the semiconductor chip 3. Each of the bump electrodes 31 includes a solder hump 4. Alternatively, the conductor wiring 21 on the board 2, not the hump electrodes 31, may include the solder bumps 4. Still alternatively, both the bump electrodes 31 and the conductor wiring 21 may include the solder bumps 4. That is to say, the bump electrodes 31 and/or the conductor wiring 21 on the board 2 of the semiconductor chip 3 may include the solder bumps 4. The solder bumps 4 may be made of lead-free solder with a melting point equal to or higher than 210° C., such as Sn—3.5 Ag (with a melting point of 221.T.), Sn—2.5 Ag—0.5 Cu—1 Bi (with a melting point of 214° C.), Sn—0.7 Cu with a melting point of 227° C.), or Sn—3 Ag—0.5 Cu (with a melting point of 217° C.).

Next, the semiconductor chip 3 is bonded facedown onto the board 2. For this purpose, the semiconductor chip 3 is positioned with respect to, and arranged in place over, the board 2 such that the bump electrodes 31 of the semiconductor chip 3 are stacked exactly on the conductor wiring 21 on the board 2. In this state, the semiconductor chip 3 and the board 2 are heated to raise the temperature of the solder bumps 4 to a predetermined temperature, which is appropriately set according to the composition of the solder bumps 4 and the chemical makeup of a sealing acrylic composition and which may fall within the range from 180° C. to 300° C., for example. Heating the solder bumps 4 causes the solder humps 4 to melt, thus electrically connecting the hump electrodes 31 and the conductor wiring 21 together.

Next, Composition (X) is injected into the gap between the board 2 and the semiconductor chip 3. In this process step, the Composition (X) may be injected after having been heated to have its viscosity decreased as needed. At this time, the Composition (X) may be heated to a temperature falling within the range from 40° C. to 100° C., for example. This allows the Composition (X) to flow through the gap between the board 2 and the semiconductor chip 3 to fill the gap with the Composition (X).

Subsequently, the Composition (X) is heated. This causes the Composition (X) to be cured thermally and turn into the sealant 5. The conditions for heating the Composition (X) are determined according to the chemical makeup of the Composition (X) and may include a heating temperature of 80 to 150° C. and a heating duration of 5 to 120 minutes, for example.

In this manner, a semiconductor device 1 including the board 2, the semiconductor chip 3, and the sealant 5 is fabricated.

In the example described above, after the semiconductor chip 3 has been bonded onto the board 2, the gap between the semiconductor chip 3 and the board 2 is filled with the Composition (X), which is then allowed to be cured to make the sealant 5.

However, this is not the only method of making the sealant 5 but just an example. According to an alternative method of making the sealant 5, before the semiconductor chip 3 is bonded onto the board 2, the Composition (X) is applied onto either the semiconductor chip 3 or the board 2. After that, the semiconductor chip 3 is arranged in place over the board 2 such that the Composition (X) is interposed between the semiconductor chip 3 and the board 2. Thereafter, the semiconductor chip 3 is electrically connected to the board 2 and the Composition (X) is allowed to be cured to make the sealant 5. When the sealant 5 is made by such a method, the Composition (X) is called an underfill agent supplied in advance or non-conductive paste (NCP), for example. That is to say, the Composition (X) may be the underfill agent supplied in advance or NCP, for example.

Next, the Composition (X) will be described. The Composition (X) contains a thermosetting component. The Composition (X) is liquid. When cured thermally, the Composition (X) turns into a cured product having a relative dielectric constant of 3.2 or less at 25° C. and a dielectric loss tangent of 0.013 or less at 25° C.

According to this embodiment, when cured thermally, the Composition (X) turns into the sealant 5 with a low relative dielectric constant and a low dielectric loss tangent. Interposing such a sealant 5 between the board 2 and the semiconductor chip 3 in the semiconductor device 1 allows the sealant 5 to improve the RF characteristics of the semiconductor device 1.

The Composition (X) suitably contains: a mono- or bifunctional acrylic compound; a thermo-radical polymerization initiator; silica; and an elastomer including a 1,2-vinyl group. The Composition (X) is suitably liquid and suitably has a property of turning, when cured thermally, into a cured product having a relative dielectric constant of 3.2 or less at 25° C. and a dielectric loss tangent of 0.013 or less at 25° C. In this case, thermally curing the Composition (X) allows for obtaining a sealant 5 with a particularly low relative dielectric constant, a particularly low dielectric loss tangent, high thermal resistance, and high elasticity.

The relative dielectric constant of the cured product is suitably at most equal to 2.8, and more suitably 2.5 or less. The cured product may have a relative dielectric constant of at least 1.5, for example. However, this is only an example and should not be construed as limiting. Meanwhile, the dielectric loss tangent of the cured product is suitably at most equal to 0.01 and more suitably 0.08 or less. The cured product may have a dielectric loss tangent of at least 0.002, for example. However, this is only an example and should not be construed as limiting.

Note that methods for measuring the dielectric loss tangent and the relative dielectric constant will be described later when the evaluation test is described for working examples of the present invention.

The Composition (X) suitably has a viscosity of 100 Pa·s or less at 25° C. This facilitates filling the gap between the semiconductor chip 3 and the board 2 with the Composition (X) in making the sealant 5.

The Composition (X) particularly suitably has a viscosity of 50 Pa·s or less at 25° C. in that case, the Composition (X) may have good flowability. This reduces the chances of, particularly when the Composition (X) is injected into the gap between the semiconductor chip 3 and the board 2 after the semiconductor chip 3 has been bonded onto the board 2, the Composition (X) failing to fill the gap sufficiently. Note that a method for measuring the viscosity will be described later when the evaluation test is described for working examples of the present invention.

The Composition (X) suitably has a thixotropic index of 2 or less at 25° C. In that case, the Composition (X) may have good flowability as well. This reduces the chances of, particularly when the Composition (X) is injected into the gap between the semiconductor chip 3 and the board 2 after the semiconductor chip 3 has been bonded onto the board 2, the Composition (X) failing to fill the gap sufficiently. The thixotropic index is more suitably at most equal to 1.5 and even more suitably 1.2 or less. The Composition (X) may have a thixotropic index of at least 0.5, for example. However, this is only an example and should not be construed as limiting. Note that a method for measuring the thixotropic index will be described later when the evaluation test is described for working examples of the present invention.

In particular, the Composition (X) suitably has an invasiveness test evaluation value of 10 mm car more. In that case, the Composition (X) is able to exhibit excellent flowability even in a narrow space. This significantly reduces the chances of, particularly when the Composition (X) is injected into the gap between the semiconductor chip 3 and the board 2 after the semiconductor chip 3 has been bonded onto the board 2, the Composition (X) failing to fill the gap sufficiently. Recently, there has been an increasing demand for increasing the size of the semiconductor chip 3 in the semiconductor device 1 with the gap between the semiconductor chip 3 and the board 2 and the interval between the bump electrodes 31 both narrowed. Even when such a demand needs to be fulfilled, the Composition (X) is still allowed to flow between the semiconductor chip 3 and the board 2 smoothly enough to reduce the chances of failing to fill the gap sufficiently. The invasiveness test evaluation value is more suitably at least equal to 20 mm, and even more suitably 50 mm or more. Note that a method for carrying out the invasiveness test will be described later when the evaluation test is described for working examples of the present invention.

Furthermore, a cured product of the Composition (X) suitably has a glass transition temperature equal to or higher than 100° C. This allows the semiconductor device 1 to have excellent thermal resistance. The glass transition temperature is more suitably at least as high as 125° C., and even more suitably 150° C. or higher. Note that a method for measuring the glass transition temperature will be described later when the evaluation test is described for working examples of the present invention.

The cured product suitably has a coefficient of linear thermal expansion of 50 ppm/° C. or less at a temperature equal to or lower than the glass transition temperature. That is to say, when the temperature of the cured product is equal to or lower than the glass transition temperature thereof, the coefficient of linear thermal expansion (hereinafter referred to as "CTE1" of the cured product is suitably equal to or less than 50 ppm/° C.

The cured product suitably has a coefficient of linear thermal expansion of 120 ppm/° C. or or less at a temperature equal to or higher than the glass transition temperature. That is to say, when the temperature of the cured product is equal to or higher than the glass transition temperature thereof, the coefficient of linear thermal expansion. (hereinafter referred to as "CTE2") of the cured product is suitably equal to or less than 120 ppm/° C.

Note that a method for measuring CTE1 and CTE2 will be described later when the evaluation test is described for working examples of the present invention.

The cured product having such a low coefficient of linear thermal expansion reduces the warp and damage of the semiconductor device 1 due to a difference in coefficient of linear thermal expansion between the sealant 5 and the semiconductor chip 3. Among other things, semiconductor chips and CMOS chips of SiGe, which have recently expanded their application to RF devices, have a lower coefficient of linear thermal expansion and a larger size than semiconductor chips of GaAs. Therefore, the semiconductor chips of the former type tends to cause warp and damage to the semiconductor device 1 more easily than the semiconductor chips of the latter type. This embodiment, however, is still able to reduce the warp and damage of the semiconductor device 1 even in the semiconductor chips of SiGe.

CTE1 is more suitably at most equal to 40 ppm/° C., and even more suitably 30 ppm/° C. or less. In practice, CTE1 is at least equal to 10 ppm/° C. However, this is only an example and should not be construed as limiting. CTE2 is more suitably at most equal to 100 ppm/° C.; and even more suitably 80 ppm/° C. or less. In practice, CTE2 is at least equal to 30 ppm/° C., However, this is only an example and should not be construed as limiting.

The Composition (X) suitably has a gel time of at most 100 seconds, more suitably 15 seconds or less, at 150° C. This allows the composition to have excellent curability. The gel time may be measured by the following method. To measure the gel time, no sooner 1 g of Composition (X) is put on a hot plate heated to a temperature falling within the range of 150° C.±2° C. than the Composition (X) is stirred up under a condition of 1 revolution per second with a stirring jig made of polytetrafluoroethylene. The gel time is the amount of time to pass before the Composition (X) becomes no longer stirrable due to an increase in its viscosity since the start of stirring.

The reaction initiation temperature of the Composition (X) suitably falls within the range from 80° C. to 160° C., more suitably falls within the range from 100° C. to 150° C., and even more suitably falls within the range from 100° C. to 130° C. The reaction initiation temperature may be measured by performing differential scanning calorimetry on the Composition (X) put on an aluminum pan using, for example, DSC 7020 (manufactured by Seiko instruments Inc.) as a measuring instrument within the atmosphere at a temperature increase rate of 10° C./min and within a temperature range from 30° C. to 300° C. In a thermogram thus obtained, an intersection between its baseline and a line drawn by extrapolating a rising gradient of a peak of heat generation produced by the reaction is regarded as the reaction initiation temperature.

Such properties of the Composition (X) and the cured product are realized by the chemical makeup of the Composition (X) to be described below.

As described above, the Composition (X) has a thermosetting component.

The compound contained in the thermosetting component suitably has low polarity. This reduces the relative dielectric constant of the cured product. For that purpose, the compound contained in the thermosetting component suitably contains no or little N, O, or S.

The structure obtained by polymerizing the thermosetting component is suitably rigid. This decreases the dielectric loss tangent and coefficient of linear thermal expansion of the cured product and increases the glass transition temperature of the cured product. To achieve this, the compound contained in the thermosetting component suitably has a bulky structure having a lot of hydrocarbon skeletons such as a t-butyl group.

It is also recommended that the structure obtained by polymerizing the thermosetting component have high crosslinking density. This increases the glass transition temperature of the cured product.

The thermosetting component contains at least one of an epoxy compound or an acrylic compound.

If the thermosetting component contains an epoxy compound, the epoxy compound may be a compound having two or more epoxy groups per molecule. The epoxy compound may contain at least one component selected from the group consisting of: bisphenol A type epoxy compounds; bisphenol F type epoxy compounds; biphenyl type epoxy compounds; o-cresol novolak type epoxy compounds; dicyclopentadiene-type epoxy compounds; naphthalene ring-containing epoxy compounds; alicyclic epoxy compounds; bromine-containing epoxy compounds; and hydrogenated ones thereof.

Among other things, the epoxy compound suitably has a naphthalene skeleton. This further increases the glass transition temperature. It is also recommended that the epoxy compound be liquid with low viscosity. In that case, even when the content of a filler in the Composition (X) is increased, the Composition (X) is still able to maintain low viscosity. Thus, this not only keeps the viscosity of the Composition (X) low but also decreases the coefficient of linear thermal expansion and dielectric loss tangent of the cured product.

If the thermosetting, component contains an epoxy compound, the thermosetting component suitably further contains a curing agent. The curing agent may be any compound as long as the curing agent reacts with, and cures, the epoxy compound. The curing agent contains at least one component selected from the group consisting of acid anhydrides, amines, imidazoles, phenolic resins, polythiol, and cyanates.

The equivalent amount of the curing agent may fall within the range from 0.6 to 1.4 eq with respect to one equivalent of the epoxy compound.

In particular, the curing agent suitably contains an acid anhydride. The acid anhydride contributes to decreasing the viscosity of the Composition (X). Also, imidazole is suitably added in a catalytic amount to the Composition (X) with no curing agent added thereto, to allow the epoxy compound to polymerize itself when the Composition (X) is thermally cured. This decreases the relative dielectric constant of the cured product by lowering the polarity of the cured product.

If the thermosetting component contains an epoxy compound, then the composition suitably contains a curing accelerator. The curing accelerator may contain at least one component selected from the group consisting of amine-based curing accelerators, polyamide-based curing accelerators, imidazole-based curing accelerators, and Lewis acid-based curing accelerators. The curing accelerator is suitably a so-called "latent curing accelerator" performing curing acceleration action at temperatures equal to or higher than a certain temperature. This allows the Composition (X) to maintain good flowability by suppressing thermal curing of the Composition (X) while the Composition (X) injected into the gap between the board 2 and the semiconductor chip 3 is allowed to flow after having been heated to make the sealant 5. After that, the temperature of the Composition (X) is raised to allow the curing accelerator to perform its intended action of accelerating the thermal curing of the Composition (X). This allows the Composition (X) to be distributed sufficiently uniformly over the gap between the board 2 and the semiconductor chip 3, thus reducing the chances of failing to fill the gap sufficiently with the sealant 5. For that purpose, the curing accelerator is suitably encapsulated in a micro-capsule.

The percentage by mass of the curing accelerator may fall within the range from 0.1 to 60 percent relative to the solid content of the Composition (X), for example. As used herein, the "solid content" refers to a component to be a cured product in the Composition (X) and does not include volatile components such as a solvent.

In particular, the curing accelerator suitably contains a bulky, imidazole-based curing accelerator. This reduces the dielectric loss tangent of the cured product particularly significantly. It is also recommended that the curing accelerator contain a highly reactive, imidazole-based curing accelerator with a low melting point. This reduces the amount of the curing catalyst while maintaining good curability of the Composition (X), thus reducing the relative dielectric constant and dielectric loss tangent of the cured product.

Also, the acrylic compound refers herein to a compound including a (meth)acryloyl group. That is to say, the acrylic compound is a compound including at least one of an acryloyl group or a methacryloyl group. The acrylic compound may contain at least one of a monomer with a (meth)acryloyl group or an oligomer with a (meth)acryloyl group.

When the Composition (X) contains the acrylic compound, voids are less likely to be produced in the sealant 5 made of the Composition (X). This should be because the Composition (X) increases its viscosity during an initial stage of curing the acrylic compound by radical polymerization reaction.

In particular, the acrylic compound is a mono- or bifunctional acrylic compound. That is to say, the acrylic compound includes at least one of a mono functional acrylic compound having one (meth)acryloyl group per molecule or a bifunctional acrylic compound having two (meth)acryloyl groups per molecule.

To ensure thermal resistance for the sealant 5, the acrylic compound suitably includes a compound having two (meth) acryloyl groups per molecule (i.e., a bifunctional acrylic compound).

Examples of such compounds, each having two (meth) acryloyl groups per molecule, include ethylene glycol di(meth)acrylate, 1,4-butanediol di(meth)acrylate, 1,6-hexanediol di(meth)acrylate, 1,9-nonanediol di(meth)acrylate, 1,3-butanediol di(meth)acrylate, neopentyl glycol di(meth)acrylate, dimer diol di(meth)acrylate, dimethylol tricyclodecane di(meth)acrylate, diethylene glycol di(meth)acrylate, triethylene glycol di(meth)acrylate, tetraethylene glycol di(meth)acrylate, polyethylene glycol di(meth)acrylate, tripropylene glycol di(meth)acrylate, polypropylene glycol di(meth)acrylate, glycerin di(meth)acrylate, trimethylolpropane di(meth)acrylate, pentaerythritol di(meth)acrylate, zinc di(meth)acrylate, cyclohexane diol di(meth)acrylate, cyclohexanedimethanol di(meth)acrylate, cyclohexane diethanol di(meth)acrylate, cyclohexane dialkyl alcohol di(meth)acrylate, and dimethanol tricyclodecane di(meth) acrylate.

Examples of such compounds having two (meth)acryloyl groups per molecule include reactants between 1 mole of bisphenol A, hisphenol F, or hisphenol AD, and 2 moles of glycidyl acrylate and reactants between 1 mole of bisphenol A, bisphenol F, or bisphenol AD, and 2 moles of glycidyl methacrylate.

Examples of such compounds having two (meth)acryloyl groups per molecule further include (meth)acrylate having a crosslinked polycyclic structure. Specific examples of such compounds having two (meth)acryloyl groups per molecule include compounds expressed by the following Formula (I) and compounds expressed by the following Formula (II). Composition (X) containing at least one of a compound expressed by the following Formula (I) or a compound expressed by the following Formula (II) improves the thermal resistance of the sealant 5 particularly significantly.

[Chemical Formula 1]

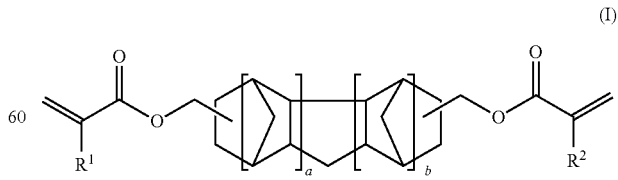

(I)

In Formula (I), $R^1$ and $R^2$ each represent either a hydrogen atom or a methyl group independently of each other, a is either 1 or 2, and b is either 0 or 1.

[Chemical Formula 2]

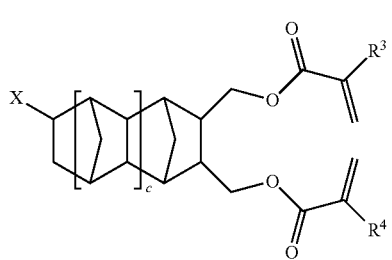

(II)

In Formula (II), $R^3$ and $R^4$ each represent either a hydrogen atom or a methyl group independently of each other, X represents a hydrogen atom, a methyl group, a methylol group, an amino group, or a (meth)acryloyloxy methyl group, and c is either 0 or 1.

More specific examples of (meth)acrylate with the crosslinked polycyclic structure include: (meth)acrylate with a dicyciopentadiene skeleton expressed by Formula (I) where a is 1 and b is 0; (meth)acrylate with a perhydro-1,4:5,8-dimethanonaphthalene skeleton expressed by Formula (II) where c is 1; (meth)acrylate with a norbornane skeleton expressed by Formula (II) where c is 0; dicyclopentadienyl diacrylate (tricyclodecane dimethanol diacrylate) expressed by Formula (I) where $R^1$ and $R^2$ each represent a hydrogen atom, a=1, and b=0; dicyclopentadienyl dimethacrylate (tricyclodecane dimethanol dimethacrylate) expressed by Formula (I) where $R^1$ and $R^2$ each represent a methyl group, a=1, and b=0; perhydro-1,4: 5,8-dimethanonaphthaiene-2,3,7-trimethylol triacrylate expressed by Formula (II) where X represents an acryloyloxymethyl group, $R^3$ and $R^4$ each represent a hydrogen atom, and c is 1; norbornane dimethylol diacrylate expressed by Formula (II) where X, $R^3$, and $R^4$ each represent a hydrogen atom, and c is 0; and perhydro-1,4: 5,8-dimethanonaphthalene-2,3-dimethylol diacrylate expressed by Formula (II) where X, $R^3$, and $R^4$ each represent a hydrogen atom, and c is 1.

Among other things, the (meth)acrylate having the crosslinked polycyclic structure suitably includes at least one of dicyclopentadienyl diacrylate (tricyclodecane dimethanol diacrylate), dicyclopentadienyl dimethacrylate (tricyclodecane dimethanol dimethacrylate), or norbornane dirnethylol diacrylate. That is to say, the Composition (X) suitably includes at least one of dicyclopentadienyl diacrylate (tricyclodecane dimethanol diacrylate), dicyclopentadienyl dimethacrylate (tricyclodecane dimethanol dimethacrylate), or norbornane dimethylol diacrylate. These compounds contribute to increasing the glass transition temperature of the cured product and decreasing the viscosity of the Composition (X).

Examples of such compounds having two (meth)acryloyl groups per molecule further include di(meth)acrylate having a structure in which alkylene oxide is added to a bisphenol skeleton. Specific examples of such compounds having two (meth)acryloyl groups per molecule include compounds expressed by the following, Formula (III) and compounds expressed by the following Formula (IV). The acrylic compound containing at least one of a compound expressed by the following Formula (III) or a compound expressed by the following Formula (IV) improves the degree of close contact between the sealant 5, the semiconductor chip 3, and the board 2:

[Chemical Formula 3]

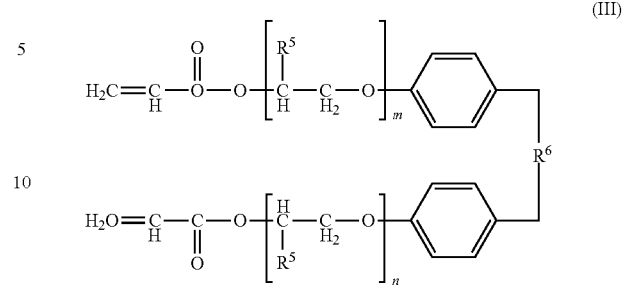

(III)

in Formula (III), $R^5$ represents hydrogen, a methyl group, or an ethyl group, $R^6$ represents a divalent organic group, and m and n each represent an integer falling within the range from 1 to 20.

[Chemical Formula 4]

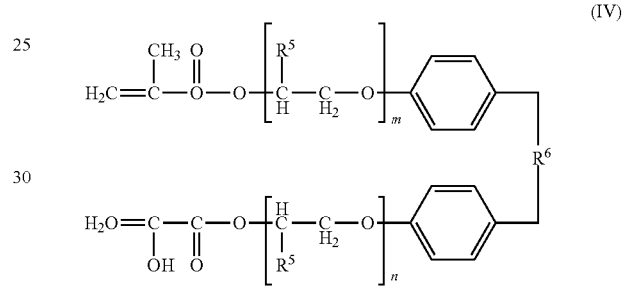

(IV)

In Formula (VI), $R^5$ represents hydrogen, a methyl group, or an ethyl group, $R^6$ represents a divalent organic group, and m and n each represent an integer falling within the range from 1 to 20.

Specific examples of di(meth)acrylate having such a structure in which alkylene oxide is added to a bisphenol skeleton include: EQ modified bisphenol A type di(meth)acrylate (where n=2 to 20) such as ARONIX M-210 and M-211B (manufactured by Toagosei Co., Ltd.), and NK ester ABE-300, A-BPE-4, A-BPE-6, A-BPE-10, A-BPE-20, A-BPE-30, BPE-100, BPE-200, BPE-500, BPE-900 and BPE-1300N (manufactured by Shin-Nakamura Chemical Co., Ltd.); EO modified bisphenol F type di(meth)acrylates (where n=2 to 20) such as ARONIX M-208 (manufactured by Toagosei Co., Ltd.); PO modified bisphenol A type di(meth)acrylate (where n=2 to 20) such as DENACOL ACRYLATE DA-250 (manufactured by Nagase ChemteX Corporation) and VISCOAT 540 (manufactured by Osaka Organic Chemical Industry Ltd); and PO modified phthalic acid diacrylate such DENACOL ACRYLATE DA-721 (manufactured by Nagase ChernteX Corporation).

The compound having two (meth)acryloyl groups per molecule suitably contains epoxy (meth)acrylate. That is to say, the acrylic compound suitably contains epoxy (meth)acrylate. In that case, the Composition (X) containing an epoxy compound, in particular, improves not only the reactivity of the Composition (X) but also the thermal resistance and the degree of close contact of the sealant 5 as well.

Epoxy (meth)acrylate is an oligomer which is an additional reactant between an epoxy compound and unsaturated monobasic acid such as methacrylic acid, for example.

The epoxy compound that is a material tor epoxy (meth) acrylate includes a glycidyl compound (bisphenol type epoxy compound) obtained by condensation reaction between a bisphenol such as bisphenol A or bisphenol F and epihalolaydrin. The epoxy compound may include an epoxy compound having a phenol skeleton. Examples of epoxy compounds having a phenol skeleton include a polyglycidyl ether (such as a phenol-novolak type epoxy compound and a cresol-novolak type epoxy compound) obtained by condensation reaction between a phenol novolak (which is a condensate of phenol or cresol and aldehyde such as formalin) and epihalohydrin. Optionally, the epoxy compound may include an epoxy compound with a cyclohexyl ring.

Epoxy (meth)acrylate suitably includes bisphenol A type epoxy acrylate which is either solid or liquid with a viscosity of 10 Pa·s or more at 25° C. bisphenol A type epoxy acrylate may be expressed, for example, by the following Formula (V):

[Chemical Formula 5]

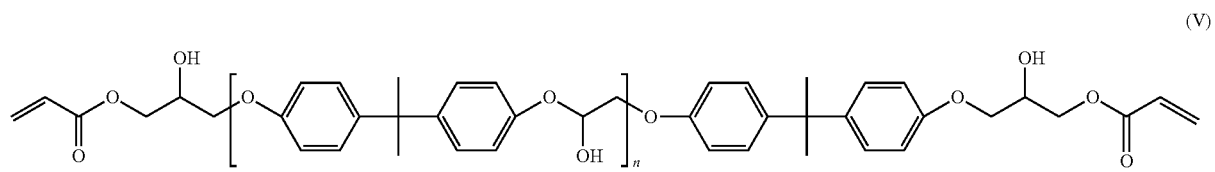

(V)

In Formula (V), n represents a positive integer.

Examples of commercially available bisphenol A type epoxy acrylate include DENACOL ACRYLATE DA-250 (manufactured by Nagase ChemteX Corporation and having a viscosity of 60 Pa·s at 25° C.), DENACOL ACRYLATE DA-721. (manufactured by Nagase ChemteX Corporation and having a viscosity of 100 Pa·s at 25° C.), RIPDXY VR-60 (manufactured by Showa High Polymers Co., Ltd.; solid at an ordinary temperature), and RIPDXY VR-77 (manufactured by Showa High Polymers Co., Ltd. and having a viscosity of 100 Pa·s at 25° C.).

The acrylic compound may contain, for example, (meth) acrylate having a crosslinked polycyclic structure and accounting for 10-50% by mass of the entire acrylic compound, di(meth)acrylate having a structure in which alkylene oxide is added to a bisphenol skeleton and accounting for 3-20% by mass of the entire acrylic compound, and epoxy (meth)acrylate accounting for 5-30% by mass of the entire acrylic compound.

Optionally, the acrylic compound may further contain any of various vinyl monomers, such as a mono-functional vinyl monomer; in addition to the components described above.

In particular, the acrylic compound suitably contains a compound having a dicyclopentadiene skeleton. Such a compound having a dicyclopentadiene skeleton contributes to decreasing the viscosity of the Composition (X) and increasing the glass transition temperature and decreasing the dielectric loss tangent of the cured product.

If the thermosetting component contains an acrylic compound, then the thermosetting component may further contain polyphenylene ether having a substituent with radical polymerizability at an end. The polyphenylene ether may include a polyphenylene ether chain and a substituent bonded to an end of the polyphenylene ether chain.

The substituent may have any structure without limitation as long as the substituent has radical polymerizability. Examples of the substituents include a group with a carbon-carbon double bond.

The substituent is suitably a group with a carbon-carbon double bond. In that case, reaction of the substituent to the acrylic compound incorporates polyphenylene ether into the skeleton of a macromolecule. This allows the cured product of the Composition (X) to exhibit excellent thermal resistance and humidity resistance.

For example, the substituent may have either a structure expressed by the following Formula (1) or a structure expressed by the following Formula (2):

[Chemical Formula 6]

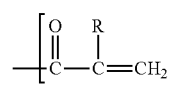

(1)

In Formula (1), R represents either hydrogen or an alkyl group. If R is an alkyl group, the alkyl group is suitably a methyl group.

[Chemical Formula 7]

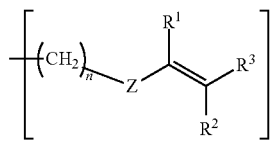

(2)

In Formula (2), n is an integer falling within the range from 0 to 10 (e.g., n=1), 7 represents an arylene group, and $R^1$ to $R^3$ each represent either hydrogen or an alkyl group independently of each other. If n=0 in Formula (2), then Z is directly bonded to an end of a polyphenylene ether ring (c1) of polyphenylene ether (C).

Among other things, the substituent suitably has the structure expressed by Formula (1).

Polypheulene ether may have a compound having a structure expressed by the following Formula (3):

[Chemical Formula 8]

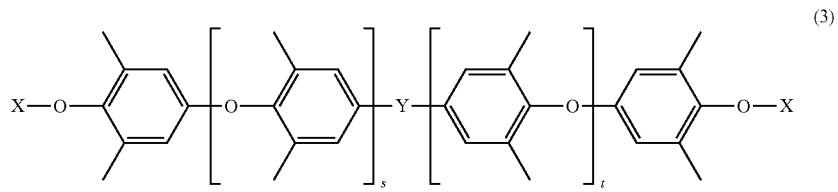

In Formula (3), Y represents either an alkylene group with a carbon number of 1 to 3 or a direct bond. Y may be a dimethylmethylene group, for example. In Formula (3), X represents a substituent, which may be a group having the structure expressed by Formula (1) or a group having the structure expressed by Formula (2), for example, Among other things, X is suitably a group having the structure expressed by Formula (1). Also, in Formula (3), s is a number equal to or greater than 0, t is also a number equal to or greater than 0, and the sum of s and t is a number equal to or greater than 1. Specifically, s is suitably a number falling within the range from 0 to 20, t is suitably a number falling within the range from 0 to 20, and the sum of s and t is suitably a number falling within the range from 1 to 30.

If the thermosetting component contains polyphenylene ether, the ratio of polyphenylene ether to the total mass of the acrylic compound and the polyphenylene ether suitably falls within the range from 45% to 70% by mass. When this ratio is equal to or greater than 45% by mass, the cured product may have a higher degree of thermal resistance. Also, when this ratio is equal to or less than 70% by mass, the cured product may have a higher degree of flexibility. The ratio more suitably fails within the range from 50% to 65% by mass.

If the thermosetting component contains an acrylic compound, then the thermosetting component may further contain another non-polyphenylene-ether compound that causes thermal curing reaction with the acrylic compound. Examples of such compounds include a bismaleimide resin.

Also, if the thermosetting component contains an acrylic compound, then the thermosetting component may contain a crosslinking aid having three or more radical polymerizable functional groups per molecule (hereinafter simply referred to as a "crosslinking aid"). That is to say; the Composition (X) may further contain the crosslinking aid. The radical polymerizable functional group may be an ethylenically unsaturated bond, for example.

Examples of compounds contained in the crosslinking aid include compounds each having three or more (meth)acryloyl groups per molecule. Specifically, examples of such compounds each having three or more (meth)acryloyl groups per molecule include pentaerythritol triacrylate, pentaerythritol tetraacrylate, pentaerythritol pentaacrylate, ethoxylated (3) trimethylolpropane triacrylate, ethoxylated (6) trimethylolpropane triacrylate, ethoxylated (9) trimethylolpropane triacrylate, propoxylated (6) triinethylolpropane triacrylate, propoxylated (3) glyceryl triacrylate, high propoxylated (55) glyceryl triacrylate, ethoxylated (15) trimethylolpropane triacrylate, trimethylolpropane trimeth-acrylate, tetraethylene glycol diacrylate, dimethylol propane tetraacrylate, tripropylene glycol diacrylate, pentaacrylate ester, 1.0 1,3-adamantane-diol dimethacrydate, 1,3-adamantane dial diacrylate, 1,3-adamantane dimethanol dimethacrylate, 1,3-adamantane dimethanol diacrylate, and ethoxylated isocyanuric acid triacrylate. Examples of the compounds contained in the crosslinking aid also include triallyl isocyanurate. The crosslinking aid may contain at least one compound selected from the group consisting of these compounds.

The crosslinking aid suitably contains a compound having a triazine skeleton. That is to say, the Composition (X) suitably contains a crosslinking aid having a triazine skeleton. The crosslinking aid having a triazine skeleton contributes to increasing the glass transition temperature of the cured product, among other things. This allows the semiconductor device 1 to have a particularly high degree of thermal resistance. Such a crosslinking aid having a triazine skeleton contains at least one of ethoxylated isocyanuric acid triacrylate or triallyl isocyanurate. In particular, the Composition (X) containing triallyl isocyanurate allows triallyl isocyamirate to contribute to decreasing the viscosity of the Composition (X).

The content of the crosslinking aid in the Composition (X) suitably falls within the range from 1 to 50% by mass relative to the entire mass of the acrylic compound in the Composition (X). In that case, the crosslinking aid contributes particularly significantly to increasing the glass transition temperature of the cured product. The content of the crosslinking aid added is more suitably at least equal to 4.8% by mass and even more suitably 5% by mass or more. The content of the crosslinking aid added is more suitably at most equal to 30% by mass and even more suitably 20.5% by mass or less.

If the thermosetting component contains an acrylic compound, then the Composition (X) suitably contains a thermoradical polymerization initiator.

The thereto-radical polymerization initiator suitably has the ability to trigger thereto-radical polymerization reaction at a temperature equal to or higher than a certain temperature. That is to say, the thereto-radical polymerization initiator suitably has latency. This allows the Composition (X) to maintain good flowability by suppressing thermal curing of the Composition (X) while the Composition (X) injected into the gap between the board 2 and the semiconductor chip 3 is allowed to flow after having been heated to make the sealant 5. After that, the temperature of the Composition (X) is increased to allow the thereto-radical polymerization initiator to perform its intended action of accelerating the thermal curing of the Composition (X). This allows the Composition (X) to be distributed sufficiently uniformly over the gap between the board 2 and the semiconductor chip 3, thus reducing the chances of failing to fill the gap with the sealant 5 sufficiently.

The thereto-radical polymerization initiator may contain an organic peroxide, for example. To allow the organic peroxide to have latency, the organic peroxide suitably has a one-minute half-life temperature falling within the range from 100° C. to 200° C.

Specific examples of the organic peroxide include t-butyl peroxy-2-ethylhexyl monocarbonate (with a one-minute half-life temperature of 161.4° C.), t-butyl peroxy benzoate (with a one-minute half-life temperature 166.8° C.), t-butyl cumyl peroxide (with a one-minute half-life temperature of 173.3° C.), dicumyl peroxide (with a one-minute half-life temperature of 175.2° C.), α-α'-di(t-butylperoxy) diisopropylbenzene (with a one-minute half-life temperature of 175.4° C.), 2,5-dimethyl-2,5-di(t-butylperoxy) hexane (with a one-minute half-life temperature of 179.8° C.), di-t-butyl peroxide (with a one-minute half-life temperature of 185.9° C.), and 2,5-dimethyl-2,5-bis(t-butylperoxy) hexyne (with a one-minute half-life temperature of 194.3° C.).

The content of the thermo-radical polymerization initiator suitably falls within the range from 0.25 to 2.0 parts by mass relative to 100 parts by mass of the acrylic compound and components to cause thermal curing reaction with the acrylic compound. This allows the cured product to have good physical properties. The content of the thermo-radical polymerization initiator more suitably falls within the range from 0.5 to 1.5 parts by mass.

The Composition (X) may contain an elastomer. The elastomer contributes to lowering the modulus of elasticity of the cured product and reducing the warp and damage of the semiconductor device 1. In addition, the elastomer also reduces the damage done to the semiconductor device 1 that has been heated repeatedly. Furthermore, the elastomer further contributes to lowering the relative dielectric constant of the cured product as well.

The elastomer suitably contains a compound having a 1,2-vinyl group. That is to say, the Composition (X) suitably further contains an elastomer having a 1,2-vinyl group. Such an elastomer having a 1,2-vinyl group is able to react with the acrylic compound in the Composition (X), and therefore, less likely to lower the glass transition temperature of the cured product. Thus, the elastomer having a 1,2-vinyl group allows the semiconductor device 1 to maintain good thermal resistance.

The elastomer suitably contains liquid butadiene rubber. The liquid butadiene rubber contributes to relaxing the stress in the cured product, among other things. The liquid butadiene rubber also contributes to lowering the dielectric loss tangent of the cured product. The liquid butadiene rubber suitably includes hydrogenated liquid butadiene rubber. The hydrogenated liquid butadiene rubber contributes to lowering the dielectric loss tangent of the cured product, among other things. In particular, the elastomer suitably contains liquid polybutadiene having a 1,2-vinyl group.

The elastomer may contain additional components other than liquid butadiene rubber. For example, the elastomer may also contain an isoprene polymer with a maleic anhydride as an adduct such as maleic anhydride-modified polybutadiene. The Composition (X) containing an isoprene polymer with a maleic anhydride as an adduct allows the isoprene polymer with a maleic anhydride as an adduct to further increase the degree of close contact between the sealant 5, the semiconductor chip 3, and the board 2 in the semiconductor device 1. The isoprene polymer with a maleic anhydride as an adduct suitably has a 1,2-vinyl group.

The elastomer may contain a butadiene-styrene copolymer. The Composition (X) containing a butadiene-styrene copolymer allows the butadiene-styrene copolymer to relax the stress in the cured product, thus contributing to lowering the dielectric loss tangent of the cured product, among other things. The butadiene-styrene copolymer suitably includes a 1,2-vinyl group.

If the Composition (X) contains an elastomer, the percentage of the elastomer to the entire Composition (X) suitably falls within the range from 5% to 20% by mass. When this percentage is equal to or greater than 5% by mass, the dielectric loss tangent of the cured product is reducible particularly significantly. When this percentage is equal to or less than 20% by mass, not only an increase in the viscosity of the Composition (X) but also a decline in the glass transition temperature of the cured product and an increase in coefficient of linear thermal expansion are reducible as well. The percentage of the elastomer more suitably falls within the range from 6.4% to 10.4% by mass and even more suitably falls within the range from 6.4% to 8.2% by mass.

Optionally, the Composition (X) may further contain a filler, which may be either an inorganic filler or an organic filler, whichever is appropriate.

The Composition (X) containing an inorganic filler allows the inorganic filler to contribute to decreasing the coefficient of linear thermal expansion of the cured product, and thereby reducing the warp and damage of the semiconductor device 1. In addition, the inorganic filler also contributes to improving the thermal conductivity of the sealant 5, thus efficiently dissipating, through the sealant 5, the heat generated from the semiconductor chip 3.

The inorganic filler may contain at least one material selected from the group consisting of: silica such as fused silica, synthetic silica, crystalline silica, or hollow silica; metal oxides such as alumina and titanium oxide; silicates such as talc, calcined clay, uncalcined clay, mica, and glass; carbonates such as calcium carbonate, magnesium carbonate, and hydrotalcite; hydroxides such as aluminum hydroxide, magnesium hydroxide, and calcium hydroxide; sulfates or sulfites such as barium sulfate, calcium sulfate, and calcium sulfite; borates such as zinc borate, barium metaborate, aluminum borate, calcium borate, and sodium borate; and nitrides such as aluminum nitride, boron nitride, and silicon nitride. The based silica may be either fused spherical silica or fused crushed silica, whichever is appropriate.

The inorganic filler suitably contains silica, among other things. That is to say, the Composition (X) suitably contains silica as described above. In that case, the silica contributes to increasing the elasticity of the cured product and decreasing the coefficient of linear thermal expansion and dielectric loss tangent thereof, among other things. In particular, silica suitably contains hollow silica. In that case, the hollow silica contributes to lowering the relative dielectric constant of the cured product particularly significantly. The hollow silica suitably has a porosity of 40 to 70%.

If the Composition (X) contains silica, the ratio by mass of the silica to the entire Composition (X) is suitably at least 20%, more suitably 30% or more, and even more suitably 49% or more. The ratio by mass of the silica is suitably at most 70%, more suitably 73.9% or less, and even more suitably 65% or less.

If the Composition (X) contains silica, then the Composition (X) may further contain at least one of an organic filler or another inorganic filler other than silica. The organic filler and the other non-silica inorganic filler contribute to lowering the relative dielectric constant of the cured product particularly significantly. To lower the relative dielectric constant of the cured product, the Composition (X) may contain an organic filler and the organic filler may contain tetrafluoroethylene particles. That is to say, the Composition (X) suitably contains tetrafluoroethylene particles.

The inorganic filler may have any appropriate shape without limitation, examples of which include crushed, needle-like, flake-like, and spherical shapes. To improve the dispersibility of the inorganic filler in the Composition (X) and to control the viscosity of the Composition (X), the inorganic filler suitably has a spherical shape, among other things.

The organic filler suitably contains particles of a fluorocarbon polymer. Particles of the fluorocarbon polymer contribute to lowering the relative dielectric constant of the cured product. The organic filler more suitably contains polytetrafluoroethylene particles, which contribute to lowering the relative dielectric constant of the cured product, among other things.

The filler suitably has a mean particle size, which is smaller than the dimension of the gap between the board 2 and the semiconductor chip 3 bonded to the board 2. To increase the packing density of the filler in the Composition (X) and the sealant 5 and to adjust the viscosity of the Composition (X), the filler suitably has a mean particle size at most equal to 10 μm, more suitably 5 μm or less, and even more suitably 3 μm or less. The filler may have a means particle size equal to or greater than 0.1 μm, for example. However, this is only an example and should not be construed as limiting.

The thixotropic index of the Composition (X) may be regulated by adjusting various factors such as the particle size distribution, surface treatment method, and specific surface area of the filler.

As used herein, the "mean particle size" refers to a volume-based median diameter to be calculated based on the results of particle size distribution measurements by laser beam diffraction.

To adjust the viscosity of the Composition (X) or control the physical properties of the sealant 5, the filler may contain two or more components with different mean particle sizes.

The content of the filler may fall within the range from 10% to 90% by mass relative to the solid content of the Composition (X).

The Composition (X) may further include, as needed a thermoplastic resin, a dispersion stabilizer, a flame retardant, an elasticity reducer, an adhesion imparting agent, a thixotropic agent, a coloring agent, a diluent, a defoamer, a coupling agent, an ion trapping agent, and/or a radical scavenger. In particular, the Composition (X) containing a coupling agent allows the coupling agent to improve the degree of close contact between the sealant 5, the semiconductor chip 3, and the board 2.

The Composition (X) may contain a solvent. The solvent includes at least one component selected from the group consisting of methanol, ethanol, ethylene glycol monomethyl ether, ethylene glycol monoethyl ether, ethylene glycol monobutyl ether, methyl ethyl ketone, acetone, isopropyl acetone, toluene, and xylene. The content of the solvent is appropriately set such that the Composition (X) has a suitable viscosity.

EXAMPLES

Next, specific examples of the present invention will be described. Note that these are only examples of present invention and should not be construed as limiting.

(1) Preparation of Composition

A composition was prepared by mixing together the respective components shown in the makeup column of Table 1. Specifically, the components mixed together were:

Epoxy Compound 1: trifunctional glycidyl amine type epoxy resin with an epoxy equivalent of 95 g/eq.;

Epoxy Compound 2: 1,6-naphthalene diol diglycidyl ether;

Curing Agent 1: 3-methyl-hexahydrophthalic anhydride;

Curing Agent 2: trialkyl tetrahydrophthalic anhydride;

Curing Accelerator: 2-phenyl-4-methylimidazole;

Acrylic Compound 1: ethoxylated bisphenol A dimethacrylate;

Acrylic Compound 2: bisphenol A type epoxy acrylate, Product No. VR-77 (manufactured by Showa High Polymers Co., Ltd.);

Acrylic Compound 3: tricyclodecane dimethanol dimethacrylate, Product No. DCP (manufactured by Shin-Nakamura Chemical Co., Ltd.);

Crosslinking Aid 1: ethoxylated isoryanuric acid triacrylate, Product No. A-9300 (manufactured by Shin-Nakamura Chemical Co., Ltd.);

Crosslinking Aid 2: triallyl isocyanurate;

Thermo-Radical Polymerization Initiator: dicumyl peroxide, Product Name Percumyl D (manufactured by NOF Corporation);

Elastomer 1: maleic anhydride-modified polybutadiene with 1,2-vinyl group, Product No. Ricobond 1756 (manufactured by Cray Valley Ltd.);

Elastomer 2: liquid butadiene rubber with no 1,2-vinyl groups, Product No. LBR 307 (manufactured produced by Kuraray Co., Ltd.);

Elastomer 3: liquid polybutadiene with no 1,2-vinyl groups, Product Number Polyvest 110 (manufactured by Evonik Japan);

Elastomer 4: butadiene-styrene copolymer with 1,2-vinyl group, Product No. Ricon 100 (manufactured by Cray Valley Ltd.);

Coupling Agent: 3-acryloxypropyltrimethoxysilane, Product No. KBM-5103 (manufactured by Shin-Etsu Chemical Co.; Ltd.);

Inorganic Filler 1: spherical silica with an average particle size of 1.0 μm;

Inorganic Filler 2: hollow silica with an average particle size of 15 μm, a porosity of 70%, and a specific gravity of 0.5; and Inorganic Filler 3: spherical silica with an average particle size of 1.5 μm.

(2) Evaluation Tests

The composition was subjected to the following evaluation tests. The results are shown in the "Evaluation" column of Table 1.

(2-1) Viscosity Measurement

The viscosity of the composition was measured by Type B viscometer (product number DV-II manufactured by Brookfield Asset Management Inc.) under conditions including a rotor diameter of 8.74 mm, a temperature of 25° C., and number of revolutions of 50 rpm.

(2.2) Measurement of Thixotropic Index

The viscosity of the composition was measured by Type B viscometer (product number DV-II manufactured by Brookfield Asset Management Inc.) under conditions including a rotor diameter of 8.74 mm, a temperature of 25° C., and numbers of revolutions of 5 rpm and 50 rpm. The ratio $\mu_5/\mu_{50}$ of the viscosity $\mu_5$ measured at the number of revolutions of 5 rpm to the viscosity $\mu_{50}$ measured at the number of revolutions of 50 rpm was obtained as a thixotropic index.

(2.3) Measurement of Glass Transition Temperature

The composition was poured into a die of silicone and heated at 150° C. for one hour to make a cured product with dimensions of 20 mm×40 mm×3 mm.

The cured product was subjected to a thereto-mechanical analysis using a thereto-mechanical analyzer (product number SS 7100 manufactured by Seiko instruments Inc.) under conditions including a compressive force of 9.8 mN, a temperature increase rate of 5° C/min, and a temperature range of 30 to 300° C. The glass transition temperature thereof was obtained based on the results of the analysis.

(2-4) Measurement of Coefficient of Linear Thermal Expansion (CTE1) at Temperatures Equal to or Lower Than Glass Transition Temperature A thermo-mechanical analysis of the cured product was conducted under the same conditions as the measurement of the glass transition temperature. The coefficient of linear thermal expansion of the cured product was calculated based on the results obtained within a temperature range from 30° C. to a temperature lower by 15° C. than the glass transition temperature.

(2-5) Measurement of Coefficient of Linear Thermal Expansion (CTE2) at Temperatures Equal to or Higher Than Glass Transition Temperature A thereto-mechanical analysis of the cured product was conducted under the same conditions as the measurement of the glass transition temperature. The coefficient of linear thermal expansion of the cured product was calculated based on the results obtained within a temperature range from a temperature higher by 15° C. than the glass transition temperature to 300° C.

(2-6) Measurement of Relative Dielectric Constant and Dielectric Loss Tangent

The composition was poured into a die made of silicone, heated from room temperature to 100° C. in 30 minutes, maintained at 100° C. for 60 minutes, heated again to 150° C. in 15 minutes, maintained at 150° C. for 60 minutes, and then cooled to room temperature in 30 minutes, thus obtaining a cured product with a quadrangular prism shape with dimensions of 2 min×2 mm×50 mm.

The cured product was heated to 120° C. in 30 minutes and then left in a 30% RH atmosphere at 25° C. for one day.

The relative dielectric constant and dielectric loss tangent of this cured product at 25° C. were measured by cavity resonator perturbation method. This measurement was carried out using a network analyzer (product number N5230A manufactured by Keysight Technologies Inc.) as a measuring instrument at a measurement frequency of 20 GHz with the direction of the electric field aligned with the length of the cured product during the measurement.

(2-7) Heat Cycle Test

A semiconductor device was fabricated in the following manner with this composition.

As a board, Waits TEG IP80 (manufactured by WAITS Co., Ltd.) with dimensions of 10 mm×10 mm×300 μm was provided.

As a semiconductor wafer, Waits TEG CC80 (manufactured by WAITS Co., Ltd.) with dimensions of 7.3 mm×7.3 mm×100 μm was provided. The semiconductor wafer included 1048 bump electrodes, each including a Cu pillar with a height of 30 and a solder hump stacked thereon and having a height of 15 μm, and had a pitch of 80 μm between each pair of adjacent solder bumps. This semiconductor wafer was cut with a dicing saw to obtain semiconductor chips each having dimensions of 7.3 mm×7.3 mm.

Then, each of the semiconductor chips was arranged on the board such that the bump electrodes were mounted on the conductor wiring on the board, and then heated to melt the solder bumps of the bump electrodes. Thereafter, the molten solder bumps were allowed to solidify; thereby electrically connecting the bump electrodes to the conductor wiring.

Subsequently, the composition was poured to till the gap between the board and the semiconductor chip and then heated to 150° C. for one hour and thereby cured to make a sealant. In this manner, a semiconductor device was obtained.

This semiconductor device was subjected to a temperature cycle test, one cycle of which included exposing the semiconductor device to an environment at −55° C. for 30 minutes and then exposing the semiconductor device to an environment at 125° C. for 30 minutes. The value of electrical resistance between the bump electrodes located around the outer periphery of the semiconductor device yet to be subjected to the test and the conductor wiring was compared with that of electrical resistance of the semiconductor device subjected to the test. The semiconductor device that remained unchanged even after having gone through 1,000 cycles of this test was evaluated as Grade A. The semiconductor device that remained unchanged after having gone through 500 cycles of this test was evaluated as Grade B. The semiconductor device that changed significantly after having gone through 500 cycles of this test was evaluated as Grade C.

TABLE 1

| | | Examples | | | | | | Comparative Examples | | |
|---|---|---|---|---|---|---|---|---|---|---|
| | | 1 | 2 | 3 | 4 | 5 | 6 | 1 | 2 | 3 |
| Composition (parts by mass) | Acrylic compound 1 | 7.9 | 3.2 | 4.6 | 4.6 | 4.6 | | 7.9 | 10.1 | |
| | Acrylic compound 2 | 4.0 | 1.6 | 1.8 | 1.8 | 1.8 | 5.1 | 4.0 | 5 | |
| | Acrylic compound 3 | 19.4 | 22.0 | 20.5 | 20.5 | 20.5 | 23.9 | 11.0 | 13.1 | |
| | Crosslinking aid 1 | | 1.3 | | | | | | | |
| | Crosslinking aid 2 | | | 5.5 | 5.5 | 5.5 | | | | |
| | Inorganic filler 1 | 59.4 | 64.1 | 59.1 | 44.4 | 44.4 | 49 | 59.2 | 49 | |
| | Inorganic filler 2 | | | 14.8 | 14.8 | 14.8 | | | | |
| | Inorganic filler 3 | | | | | | | | | 60 |
| | Thermo-radical polymerization initiator | 0.6 | 0.5 | 0.5 | 0.5 | 0.5 | 0.73 | 0.6 | 0.74 | |
| | Elastomer 1 | 8.2 | 3.2 | 4.8 | 4.8 | 4.8 | 10.4 | | | |
| | Elastomer 2 | | | | | | 2.2 | | 21 | |
| | Elastomer 3 | | | | | | 16.5 | | | |
| | Elastomer 4 | | 3.2 | 2.2 | 2.2 | | | | | |

TABLE 1-continued

|  | Examples | | | | | | Comparative Examples | | |
| --- | --- | --- | --- | --- | --- | --- | --- | --- | --- |
|  | 1 | 2 | 3 | 4 | 5 | 6 | 1 | 2 | 3 |
| Epoxy compound 1 |  |  |  |  |  |  |  |  | 8.3 |
| Epoxy compound 2 |  |  |  |  |  |  |  |  | 8.3 |
| Curing agent 1 |  |  |  |  |  |  |  |  | 15.5 |
| Curing agent 2 |  |  |  |  |  |  |  |  | 6.7 |
| Curing accelerator |  |  |  |  |  |  |  |  | 0.4 |
| Coupling agent | 0.8 | 0.8 | 0.8 | 0.8 | 0.8 | 0.79 | 0.8 | 0.79 | 0.79 |
| Viscosity (Pa·s) | 25.8 | 25.6 | 9.4 | 47.8 | 60.2 | 11.4 | 65 | 60 | 6 |
| Thixotropic index | 0.7 | 0.5 | 0.4 | 0.9 | 1 | 0.9 | 1 | 1.4 | 1 |
| Glass transition temperature (° C.) | 116 | 170 | 180 | 233 | 165 | 103 | 86 | 106 | 151 |
| CTE1 (ppm/° C.) | 35 | 34 | 35 | 27 | 38 | 43 | 59 | 53 | 28 |
| CTE2 (ppm/° C.) | 53 | 45 | 41 | 34 | 42 | 69 | 76 | 99 | 95 |
| Relative dielectric constant | 2.89 | 2.9 | 2.88 | 2.49 | 2.6 | 2.81 | 2.74 | 2.7 | 3.4 |
| Dielectric loss tangent | 0.0077 | 0.0065 | 0.0062 | 0.0051 | 0.0065 | 0.0083 | 0.0073 | 0.0008 | 0.0136 |
| Heat cycle test | A | A | A | A | A | B | B | C | A |

The invention claimed is:

1. A thermosetting composition for use as an underfill material, the thermosetting composition comprising:
   a mono- or bifunctional acrylic compound;
   a thermo-radical polymerization initiator;
   silica; and
   an elastomer including a 1,2-vinyl group,
   the thermosetting composition being liquid, having a viscosity of 100 Pa·s or less at 25° C, and having a property of turning, when cured thermally, into a cured product having a relative dielectric constant of 3.2 or less at 25° C. and a dielectric loss tangent of 0.013 or less at 25° C.

2. The thermosetting composition for use as an underfill material of claim 1, further comprising a crosslinking aid having three or more radical-polymerizable functional groups per molecule.

3. The thermosetting composition for use as an underfill material of claim 1, wherein
   the cured product has a glass transition temperature equal to or higher than 100° C.

4. The thermosetting composition for use as an underfill material of claim 1, wherein
   the cured product has a coefficient of linear thermal expansion of 50 ppm/° C. or less at a temperature equal to or lower than a glass transition temperature.

5. The thermosetting composition for use as an underfill material of claim 1, wherein
   the cured product has a coefficient of linear thermal expansion of 120 ppm/° C. or less at a temperature equal to or higher than a glass transition temperature.

6. A semiconductor device comprising:
   a board;
   a semiconductor chip bonded facedown onto the board; and
   a sealant configured to seal a gap between the board and the semiconductor chip,
   the sealant being a cured product of the thermosetting composition for use as an underfill material of claim 1.

7. The thermosetting composition for use as an underfill material of claim 1, wherein
   the mono- or bifunctional acrylic compound contains (meth)acrylate having a crosslinked polycyclic structure, di(meth)acrylate having a structure in which alkylene oxide is added to a bisphenol skeleton, and epoxy (meth)acrylate.

* * * * *